(12) United States Patent
Li et al.

(10) Patent No.: US 12,109,607 B2
(45) Date of Patent: Oct. 8, 2024

(54) BENDING FIXTURE FOR APPLYING VARIABLE BENDING TO AN OBJECT

(71) Applicant: TRIPLE WIN TECHNOLOGY (SHENZHEN) CO. LTD., Shenzhen (CN)

(72) Inventors: Jin-Hong Li, Shenzhen (CN); Chun-Hung Chen, New Taipei (TW)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 295 days.

(21) Appl. No.: 17/829,608

(22) Filed: Jun. 1, 2022

(65) Prior Publication Data

US 2023/0092104 A1 Mar. 23, 2023

(30) Foreign Application Priority Data

Sep. 17, 2021 (CN) .......................... 202111093419.2

(51) Int. Cl.
*B21D 5/01* (2006.01)
*B21D 5/00* (2006.01)

(52) U.S. Cl.
CPC .............. *B21D 5/01* (2013.01); *B21D 5/002* (2013.01); *B21D 5/006* (2013.01)

(58) Field of Classification Search
CPC . B21D 5/006; B21D 5/01; B21D 5/04; B21D 5/042; B21D 11/10; B21D 11/20; G01N 3/20
See application file for complete search history.

(56) References Cited

FOREIGN PATENT DOCUMENTS

| CN | 108801818 A | 11/2018 |
|---|---|---|
| CN | 210139611 U | 3/2020 |

*Primary Examiner* — Debra M Sullivan
(74) *Attorney, Agent, or Firm* — ScienBiziP, P.C.

(57) ABSTRACT

A structure to apply flexing to an object to test resilience to being bent has a first portion and a second portion. The structure includes a base, a rotating member, a pressing plate, and an adjusting assembly. The base defines first and second receiving grooves, and the second receiving groove receives the first portion. The rotating member on the base is partially received in the first receiving groove. An abutting surface of the rotating member is recessed to form a third receiving groove which receives the second portion. The pressing plate on the base presses against the first portion. The adjusting assembly controls the rotating member to rotate towards the base about a desired angle, thereby causing the second portion to be bent with respect to the first portion.

18 Claims, 4 Drawing Sheets

BENDING FIXTURE FOR APPLYING VARIABLE BENDING TO AN OBJECT

FIELD

The subject matter herein generally relates to manufacturing, and more particularly to a bending fixture for bending an object.

BACKGROUND

To test flexibility of a flexible circuit board after manufacture, the flexible circuit board needs to be bent. During the test, the circuit board is placed in different bending fixtures, which bend the circuit board to different angles. Each time the circuit board is bent, a clamping fixture pulls on the circuit board, to establish the maximum tensile force that the circuit board can withstand.

However, since different bending fixtures are needed, the cost is increased. Therefore, there is a room for improvement in the art.

BRIEF DESCRIPTION OF THE DRAWINGS

Implementations of the present disclosure will now be described, by way of embodiments, with reference to the attached figures.

DETAILED DESCRIPTION

Figure 1:
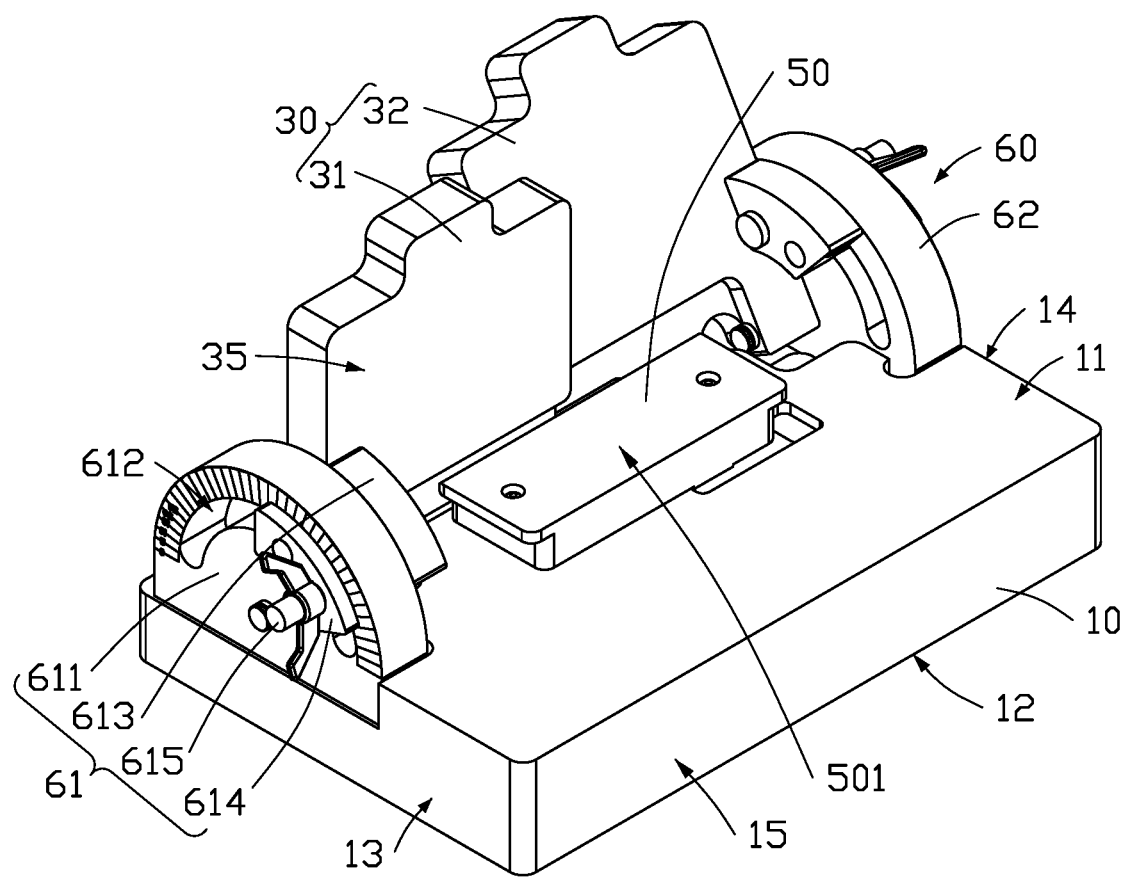
FIG. 1 is a diagrammatic view of a fixture for applying flexing to a circuit board (bending fixture) according to an embodiment of the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

Referring to FIGS. 1 to 4, a bending fixture 100 is provided according to an embodiment of the present disclosure. The bending fixture 100 is used to bend an object, such as a flexible circuit board 80 (shown in FIG. 3), to test the flexibility of the flexible circuit board 80. The bending fixture 100 includes a base 10, a rotating member 30, a pressing plate 50, and an adjusting assembly 60.

Figure 3:
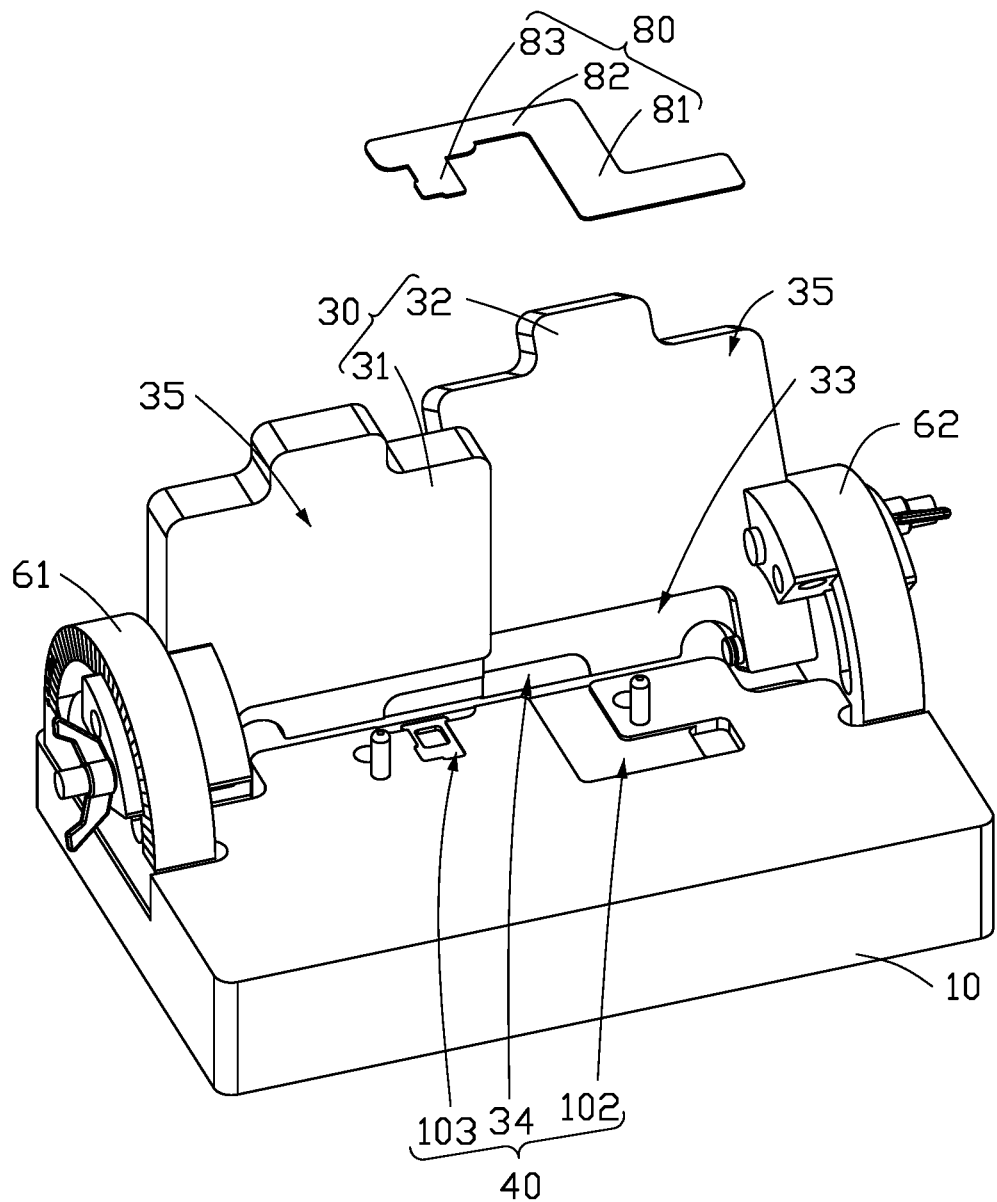
FIG. 3 is similar to FIG. 1, but a pressing plate of the bending fixture is removed and a flexible circuit board is shown.

Referring to FIG. 3, in some embodiments, the flexible circuit board 80 includes a first portion 81, a second portion 82, and a third portion 83. The second portion 82 is connected between the first portion 81 and the third portion 83.

The base 10 is used to support the flexible circuit board 80. The pressing plate 50 is detachably disposed on the base 10, and used to fix the first portion 81 and the third portion 83 of the flexible circuit board 80 on the base 10. The rotating member 30 is rotatably connected to the base 10, and the second portion 82 of the flexible circuit board 80 is placed on the rotating member 30. When the rotating member 30 rotates, an included angle between the rotating member 30 and the base 10 is changed. The adjusting assembly 60 is fixed on the base 10 and connected to the rotating member 30. The adjusting assembly 60 is used to control the rotating member 30 to rotate towards the base 10 about a desired angle, thereby allowing the flexible circuit board 80 to be bent to a certain angle (that is, the second portion 82 is bent with respect to the first portion 81 and the third portion 83).

In some embodiments, the rotating member 30 can be rotated towards the base 10 about an angle in a range of 0 degree to 160 degrees. That is, the flexible circuit board 80 can be bent to the desired angle in a range of 0 degree to 160 degrees.

Figure 2:
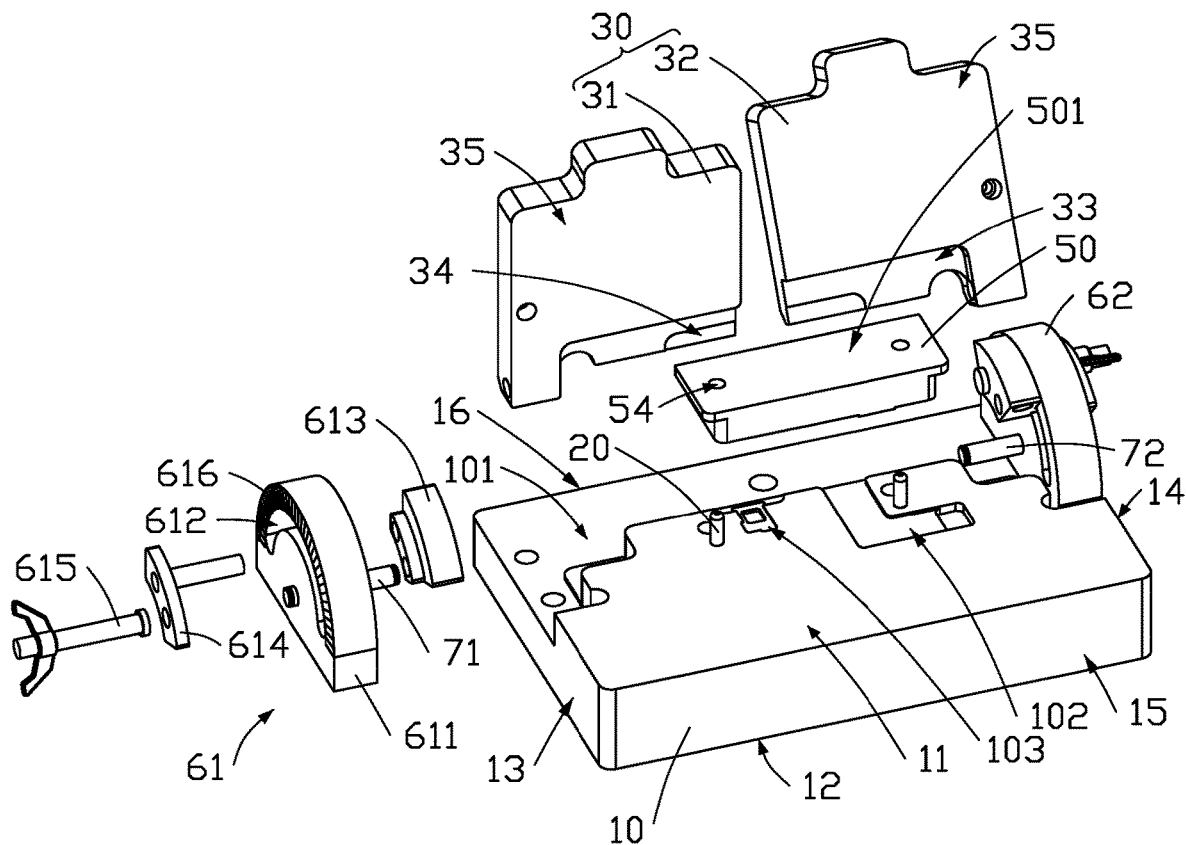
FIG. 2 is an exploded view of the bending fixture of FIG. 1.

In some embodiments, the base 10 includes a first surface 11, a second surface 12 opposite to the first surface 11, a first sidewall 13, a second sidewall 14 opposite to the first sidewall 13, a third sidewall 15, and a fourth sidewall 16 opposite to the third sidewall 15. Each of the first to fourth sidewalls 13-16 is connected in that order between the first surface 11 and the second surface 12. Referring to FIG. 2, the first surface 11 is recessed towards the second surface 12 to form a first receiving groove 101. The first receiving groove 101 passes through the first sidewall 13, the second sidewall 14, and the fourth sidewall 16. The rotating member 30 is partially received in the first receiving groove 101. The first surface 11 is also recessed towards the second surface 12 to form a second receiving groove 102 and a fourth receiving groove 103. The first portion 81 and the third portion 83 are respectively placed in the second receiving groove 102 and the fourth receiving groove 103.

The pressing plate 50 is disposed on the first surface 11 of the base 10, and at least covers the second receiving groove 102 and the fourth receiving groove 103. The pressing plate 50 is used to fix the first portion 81 and the third portion 83 respectively in the second receiving groove 102 and the fourth receiving groove 103.

Referring to FIG. 2, in some embodiments, at least one positioning column 20 protrudes from the first surface 11 of the base 10. The positioning column 20 is disposed adjacent to the second receiving groove 102 or the fourth receiving groove 103. The pressing plate 50 defines at least one through hole 54, and each positioning column 20 passes through one through hole 54. Thus, the pressing plate 50 is quickly and accurately installed on the base 10. In some embodiment, two positioning columns 20 are provided. One of the two positioning columns 20 is disposed on a side of the second receiving groove 102 away from the fourth receiving groove 103. The other positioning column 20 is disposed on a side of the fourth receiving groove 103 away from the second receiving groove 102.

Figure 4:
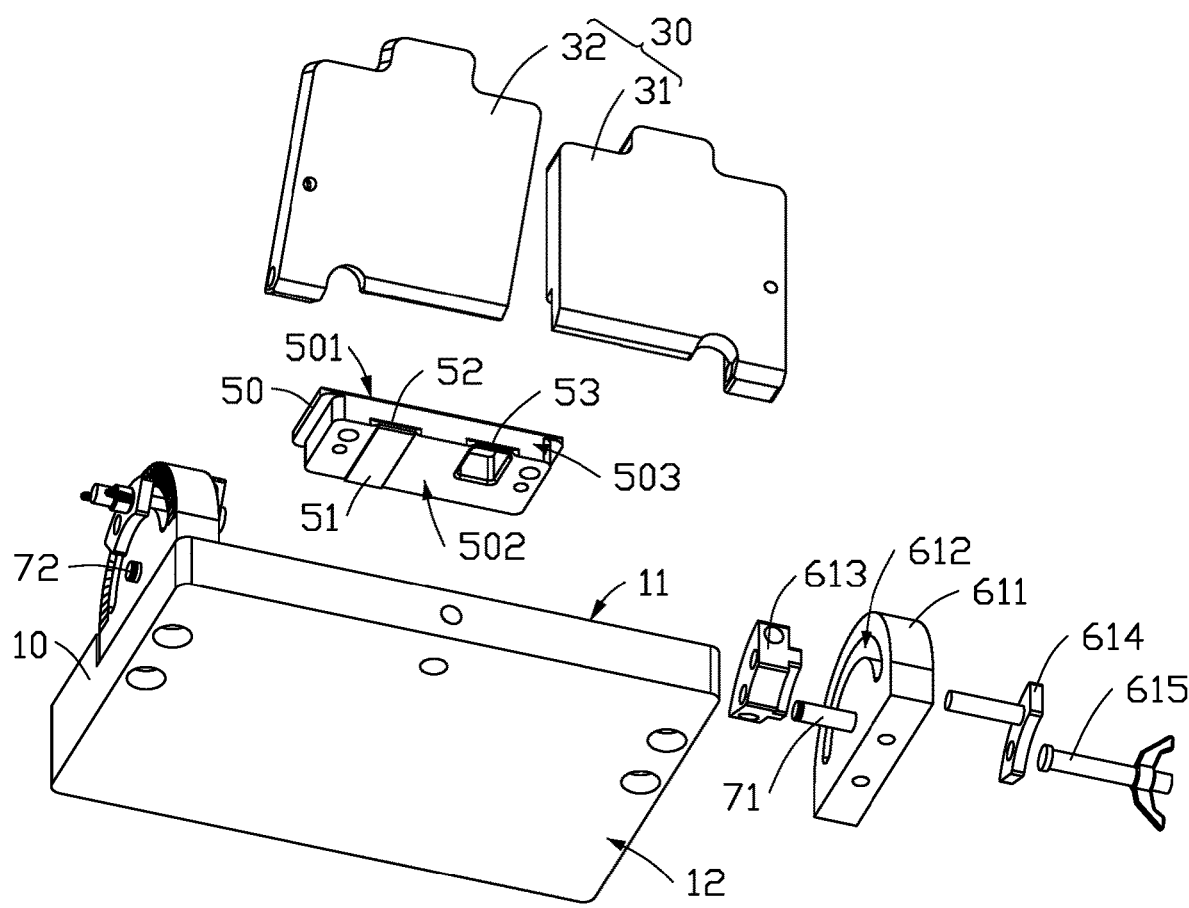
FIG. 4 is similar to FIG. 2, but showing the bending fixture from another angle.

Referring to FIG. 4, the pressing plate 50 includes a third surface 501, a fourth surface 502 opposite to the third surface 501, and a seventh sidewall 503 connected between the third surface 501 and the fourth surface 502. The fourth surface 502 faces the first surface 11. The seventh sidewall 503 faces the rotating member 30. The pressing plate 50 further includes a first pressing block 51 protruding from the fourth surface 502. The first pressing block 51 corresponds to the second receiving groove 102, and is used to press the first portion 81 in the second receiving groove 102. In some embodiments, the base 10 and the pressing plate 50 are magnetic, and an attraction exists between the pressing plate 50 and the base 10, to fix the first portion 81 in the second receiving groove 102.

Referring to FIGS. 1 to 3, the rotating member 30 has an abutting surface 35 facing the first surface 11. The rotating member 30 further includes a first rotating plate 31 and a second rotating plate 32. In some embodiments, the first rotating plate 31 and the second rotating plate 32 are separate and independent from each other. The first rotating plate 31 and the second rotating plate 32 can have a same structure, and are arranged side by side in the first receiving groove 101. The abutting surface 35 includes a surface of the first rotating plate 31 facing the first surface 11 and a surface of the second rotating plate 32 facing the first surface 11. When the rotating member 30 rotates towards the first surface 11, the included angle between the abutting surface 35 and the first surface 11 is decreased, so that the flexible circuit board 80 is bent.

Referring to FIGS. 2 and 3, a portion of the abutting surface 35 is recessed to form an avoidance groove 33. When the rotating member 30 rotates towards the first surface 11, at least a portion of the pressing plate 50 is received in the avoidance groove 33. A bottom surface of the avoidance groove 33 is further recessed to form a third receiving groove 34. A portion of the third receiving groove 34 is disposed at the first rotating plate 31. A remaining portion of the third receiving groove 34 is disposed at the second rotating plate 32. The second portion 82 of the flexible circuit board 80 is received in the third receiving groove 34. The third receiving groove 34 extends to an edge of the rotating member 30 close to the first receiving groove 101. The second receiving groove 102, the fourth receiving groove 103, and the third receiving groove 34 cooperatively form a space 40 for receiving the entire flexible circuit board 80.

In use, the flexible circuit board 80 is firstly placed in the space 40. In detail, the first portion 81 and the third portion 83 are respectively placed in the second receiving groove 102 and the fourth receiving groove 103. The second portion 82 of the flexible circuit board 80 is placed received in the third receiving groove 34. The pressing plate 50 presses against and fixes the first portion 81 and the third portion 83 of the flexible circuit board 80 on the base 10. Then, the rotating member 30 is rotated towards the first surface 11, causing the second portion 82 to be bent with respect to the first portion 81 and the third portion 83. In this embodiment, a connecting region between the first portion 81 and the second portion 82 and another connecting region between the second portion 82 and the third portion 83 are both bent, to form two bent regions. In other embodiments, one or more bent regions may be set in the flexible circuit board 80.

Referring to FIG. 4, in some embodiments, the pressing plate 50 further includes a second pressing block 52 and a third pressing block 53 protruding from the seventh sidewall 503. The second pressing block 52 and the third pressing block 53 are spaced apart from each other. The third pressing block 53 faces a portion of the third receiving groove 34 at the first rotating plate 31. The second pressing block 52 faces a portion of the third receiving groove 34 at the second rotating plate 32. The third pressing block 53 and the first rotating plate 31 cooperatively press the second portion 82 into the third receiving groove 34.

Referring to FIGS. 1 to 3, the adjusting assembly 60 includes a first adjusting member 61 and a second adjusting member 62 disposed at the sides of the rotating member 30. That is, the first adjusting member 61 is disposed at a side of the first rotating plate 31 away from the second rotating plate 32. The second adjusting member 62 is disposed at a side of the second rotating plate 32 away from the first rotating plate 31. A first rotating shaft 71 is connected between the first rotating plate 31 and the first adjusting member 61. A second rotating shaft 72 is connected between the second rotating plate 32 and the second adjusting member 62. The first rotating shaft 71 and the second rotating shaft 72 are coaxial.

Referring to FIGS. 1 and 2, the first adjusting member 61 and the second adjusting member 62 can have a same structure, so the present disclosure will describe only the structure of the first adjusting member 61 in detail, and the structure of the second adjusting member 62 is not repeated. In some embodiments, the first adjusting member 61 includes a first fixing block 611, a sliding block 613, a second fixing block 614, and a fastener 615. The first fixing block 611 is fixed at the first receiving groove 13, and defines an arcuate slot 612 passing through opposite sides of the first fixing block 611. The sliding block 613 is slidably connected in the arcuate slot 612, and is disposed between the first fixing block 611 and the first rotating plate 31. The first rotating plate 31 is fixed to the sliding block 613. Thus, the sliding block 613 drives the first rotating plate 31 to rotate about the first rotating shaft 71, thereby changing the included angle between the first rotating plate 31 and the base 10. In some embodiments, the first rotating plate 31 may be fixed to the sliding block 613 by screws or bolts. In other embodiments, the first rotating plate 31 may be fixed to the sliding block 613 magnetically. The second fixing block 614 is disposed on the side of the first fixing block 611 away from the first rotating plate 31. The fastener 615 passes through the second fixing block 614 and the sliding block 613, so as to fix the sliding block 613 on the first fixing block 611 and limit further movement of the sliding block 613. It can be understood that different positions of the sliding block 613 in the arcuate slot 612 mean different included angles between the rotating member 30 and the base 10. Thus, when the second portion 82 needs to be bent to a desired angle with respect to the first portion 81 and the third portion 83, the sliding block 613 can be controlled to rotate about the desired angle. In some embodiments, the fastener 615 may be screw or bolt.

In some embodiments, the first fixing block 611 further includes scale marks 616 adjacent to the arcuate slot 612. The scale marks 616 are arranged along the extension direction of the arcuate slot 612. Each of the scale marks 616 corresponds to a rotated angle of the rotating member 30 with respect to the base 10. Thus, a user can slide the sliding block 613 in the arcuate slot 612 until the sliding block 613 reaches a preset scale mark 616. In other embodiments, since the flexible circuit board 80 may rebound a certain amount after the bending, the scale marks 616 may be set to include the rebounding angle (that is, a compensation angle), so that the flexible circuit board 80 can be bent more accurately. For example, the flexible circuit board 80 usually rebounds about 1 degree after each bending. Thus, if the rebounding angle is ignored, the scale marks 616 can be set to match the actual bending angles of the flexible circuit board 80 (for example, a scale mark 616 labeled "30°" means that the flexible circuit board 80 will be bent to 30 degrees at this position). However, the flexible circuit board 80 usually rebounds about 1 degree after each bending. Thus, such scale mark 616 should be labeled as "29°".

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure, up to and including, the full extent established by the broad general meaning of the terms used in the claims.

What is claimed is:

1. A bending fixture configured to bend an object, the object comprising a first portion and a second portion, the bending fixture comprising:
    a base comprising a first receiving groove and a second receiving groove, the second receiving groove being configured to receive the first portion;
    a rotating member rotatably connected to the base and partially received in the first receiving groove, the rotating member comprising an abutting surface facing the base, a portion of the abutting surface being recessed to form a third receiving groove, the third receiving groove being configured to receive the second portion;
    a pressing plate detachably disposed on the base, and configured to press and fix the first portion in the second receiving groove; and
    an adjusting assembly fixed on the base and connected to the rotating member, the adjusting assembly being configured to control the rotating member to rotate towards the base about a predetermined angle, thereby bending the second portion with respect to the first portion.

2. The bending fixture according to claim 1, wherein the adjusting assembly comprises a first adjusting member and a second adjusting member, the rotating member is disposed between the first adjusting member and the second adjusting member, at least one of the first adjusting member and the second adjusting member comprises a first fixing block and a sliding block, the first fixing block comprises an arcuate slot, the sliding block is slidably connected in the arcuate slot, the rotating member is fixed on the sliding block.

3. The bending fixture according to claim 2, wherein at least one of the first adjusting member and the second adjusting member further comprises a second fixing block and a fastener, the fastener extends through the second fixing block and the sliding block, and is configured to fixing the sliding block on the first fixing block and limit movements of the sliding block.

4. The bending fixture according to claim 2, wherein the first fixing block comprises scale marks adjacent to the arcuate slot, each of the scale marks corresponds to an angle that the rotating member rotates with respect to the base.

5. The bending fixture according to claim 2, wherein the first fixing block comprises scale marks adjacent to the arcuate slot, each of the scale marks corresponds to an angle that the rotating member rotates with respect to the base minus a rebounding angle of the object after bending.

6. The bending fixture according to claim 2, wherein the rotating member comprises a first rotating plate and a second rotating plate arranged side by side, the first adjusting member is rotatably connected to the first rotating plate, the second adjusting member is rotatably connected to the second rotating plate.

7. The bending fixture according to claim 6, wherein the first rotating plate and the second rotating plate are separated from each other.

8. The bending fixture according to claim 7, wherein the first adjusting member is rotatably connected to the first rotating plate through a first rotating shaft, the second adjusting member is rotatably connected to the second rotating plate through second first rotating shaft.

9. The bending fixture according to claim 8, wherein the first rotating shaft and the second rotating shaft are coaxial.

10. The bending fixture according to claim 6, wherein a portion of the third receiving groove is disposed at the first rotating plate, another portion of the third receiving groove is disposed at the second rotating plate.

11. The bending fixture according to claim 1, wherein a portion of the abutting surface is further recessed to form an avoidance groove, at least a portion of the pressing plate is received in the avoidance groove when the rotating member rotates towards the base, the third receiving groove is disposed at a bottom surface of the avoidance groove.

12. The bending fixture according to claim 1, wherein at least one positioning columns protrudes from the base, the pressing plate comprises at least one through hole, and each of the at least one positioning column is configured to extend through one of the at least one through hole.

13. The bending fixture according to claim 1, wherein the base and the pressing plate are connected to each other by a magnetic force.

14. The bending fixture according to claim 1, wherein the base comprises a first surface, a second surface opposite to the first surface, a first sidewall, a second sidewall opposite to the first sidewall, a third sidewall, and a fourth sidewall opposite to the third sidewall; the first sidewall, the third sidewall, the second sidewall, and the fourth sidewall are connected in that order; the rotating member, the pressing plate, and the adjusting assembly are disposed on the first surface; the first surface is recessed towards the second surface to form the first receiving groove and the second receiving groove.

15. The bending fixture according to claim 14, wherein the first receiving groove passes through the first sidewall, the second sidewall, and the fourth sidewall.

16. The bending fixture according to claim 14, wherein the first surface is further recessed towards the second surface to form a fourth receiving groove, the fourth receiving groove is configured to receive a third portion of the object, the pressing plate is further configured to press and fix the third portion in the fourth receiving groove.

17. The bending fixture according to claim 1, wherein the pressing plate comprises a third surface, a fourth surface opposite to the third surface, and a seventh sidewall connected between the third surface and the fourth surface; the fourth surface faces the base, the seventh sidewall faces the rotating member; the pressing plate further comprises a first pressing block protruding from the fourth surface, the first pressing block is configured to press the first portion in the second receiving groove.

18. The bending fixture according to claim 17, wherein the pressing plate further comprises a second pressing block and a third pressing block protruding from the seventh sidewall, the third pressing block and the first rotating plate are configured to cooperatively press and fix the second portion in the third receiving groove.

* * * * *